United States Patent [19]
Kerr et al.

[11] Patent Number: 5,909,237
[45] Date of Patent: Jun. 1, 1999

[54] EXPOSING IMAGESETTER RECORDING FILM ON A COLOR-PROOFING APPARATUS

[75] Inventors: Roger S. Kerr, Brockport; John D. Gentzke, Rochester, both of N.Y.

[73] Assignee: Eastman Kodak Company, Rochester, N.Y.

[21] Appl. No.: 08/989,761

[22] Filed: Dec. 12, 1997

[51] Int. Cl.$^6$ ...................................................... G03C 8/18
[52] U.S. Cl. .................... 347/262; 347/217; 347/218; 346/134; 346/138
[58] Field of Search ..................................... 347/171, 217, 347/218, 30, 34, 262, 264; 358/297; 101/454; 346/134, 138

[56] References Cited

U.S. PATENT DOCUMENTS 5,268,708   12/1993   Harsbarger et al. ..................... 346/134
5,339,176   8/1994    Smilansky et al. ...................... 358/504

*Primary Examiner*—N. Le
*Assistant Examiner*—Hai C. Pham
*Attorney, Agent, or Firm*—Nelson Adrian Blish; David A. Novais

[57] ABSTRACT

The present invention is for a method of exposing imagesetter recording film (39) on a color-proofing apparatus (10). A sheet of support material (39) is loaded on a vacuum imaging drum (300). A sheet of imagesetter recording film (42) is loaded on the support material (39) and in registration with the support material (39). Images are formed on the imagesetter recording material (39) by removing dye from the imagesetter recording film (39).

18 Claims, 10 Drawing Sheets

EXPOSING IMAGESETTER RECORDING FILM ON A COLOR-PROOFING APPARATUS

FIELD OF THE INVENTION

This invention relates to an image processing apparatus in general, and in particular, to exposing an intended image on imagesetter recording film on a vacuum imaging drum of a color-proofer.

BACKGROUND OF THE INVENTION

Pre-press color-proofing is a procedure that is used by the printing industry for creating representative images of printed material without the high cost and time that is required to actually produce printing plates and set up a high-speed, high volume, printing press to produce an example of an intended image. These intended images may require several corrections and be reproduced several times to satisfy customer requirements. Pre-press color-proofing saves time and money getting to an acceptable finished product.

Once an intended image meets the customers requirements, films required for exposing printing plates are generated. These films are currently generated on a separate apparatus such as an imagesetter. The imagesetter recording film is used to prepare printing plates which are used to print finished copies in high volume.

An example of a commercially available image processing apparatus is shown in commonly assigned U.S. Pat. No. 5,268,708. This image processing apparatus is arranged to form an intended image on a sheet of thermal print media in which dye from a sheet of dye donor material is transferred to the thermal print media by applying thermal energy to the dye donor material. The image processing apparatus is comprised generally of a material supply assembly, a lathe bed scanning subsystem (which includes a lathe bed scanning frame, translation drive, translation stage member, printhead, and vacuum imaging drum), and thermal print media and dye donor material exit transports.

The operation of the image processing apparatus comprises metering a length of the thermal print media, in roll form, from the material assembly or carousel. The thermal print media is measured and cut into sheets of required length, transported to the vacuum imaging drum, registered, wrapped around, and secured to the vacuum imaging drum. A length of dye donor material is metered from a roll on the material supply assembly, measured, and cut into sheets of required length. The dye donor material is transported to and wrapped around the vacuum imaging drum, superposed and in registration with the thermal print media.

The thermal print media and the dye donor material are held on the spinning vacuum imaging drum by a vacuum and applied through holes in the surface of the drum while it is rotated past the printhead. The translation drive moves the printhead and translation stage member axially along the vacuum imaging drum in coordinated motion with the rotating vacuum imaging drum to produce the intended image on the thermal print media.

After the intended image has been written on the thermal print media, the dye donor material is removed from the vacuum imaging drum without disturbing the thermal print media beneath it. The dye donor material is transported out of the image processing apparatus by the dye donor material exit transport. Additional sheets of dye donor material, each a different color, are sequentially superposed with the thermal print media on the vacuum imaging drum and imaged onto the thermal print media as described above, until the intended image is completed. The completed image on the thermal print media is unloaded from the vacuum imaging drum and transported to an external holding tray on the image processing apparatus by the exit transport.

The material supply assembly comprises a carousel mounted for rotation about its horizontal axis on bearings at the upper ends of vertical supports. The carousel comprises a vertical circular plate having six material support spindles. These support spindles are arranged to carry one roll of thermal print media, and four rolls of dye donor material to provide the four primary colors used in the writing process to form the intended image and an additional roll, either a spare or a specialty color dye donor material. Each spindle has a feeder assembly to withdraw the thermal print media or dye donor material from the spindles to be cut into a sheet form. The carousel is rotated about its axis into the desired position, so that the thermal print media or dye donor material can be withdrawn, measured, and cut into sheet form of the required length, and then transported to the vacuum imaging drum.

The scanning subsystem generates a once per revolution timing signal to the data path electronics and linear control system as a clock signal while the translation drive traverses the printhead axially along the vacuum imaging drum in a coordinated motion with the vacuum imaging drum rotating past the printhead. This allows precise control of placement of each pixel to produce the intended image on the thermal print media.

The printhead includes a plurality of lasers diodes, individually modulated to supply energy to the thermal print media in accordance with an information signal. A plurality of optical fibers coupled to the laser diodes at one end, and the end to a fiber optic array within the printhead. The printhead is movable relative to the longitudinal axis of the vacuum imaging drum. The dye is transferred to the thermal print media as the radiation, transferred from the laser diodes by the optical fibers to the printhead and thus to the dye donor material, is converted to thermal energy in the dye donor material.

The vacuum imaging drum is cylindrical in shape and includes a hollow interior portion. A plurality of holes extends through a surface of the drum applying a vacuum from the interior of the vacuum imaging drum, which maintains the position of the thermal print media and dye donor material as the vacuum imaging drum rotates.

The ends of the vacuum imaging drum are enclosed by cylindrical plates, each containing a centrally disposed spindle. The spindles extend through support bearings and are attached to the lathe bed scanning frame. The drive end spindle extends through the support bearing and is stepped down to receive a DC drive motor armature. The opposite spindle is provided with a central vacuum opening in alignment with a vacuum fitting with an external flange that is rigidly mounted to the lathe bed scanning frame. The vacuum fitting has an extension which is closely spaced with the vacuum spindle forming a small clearance, which configuration provides a slight vacuum leak between the outer diameter of the vacuum fitting and the inner diameter of the opening of the vacuum spindle. This assures that no contact exists between the vacuum fitting and the vacuum imaging drum which might impart uneven movement to the vacuum imaging drum during its rotation.

The opposite end of the vacuum fitting is connected to a high-volume vacuum blower which produces a vacuum of 50–60 inches of water (93.5–112.2 mm of mercury) at an air flow volume of 60–70 cfm (28.368–33.096 liters/sec). The vacuum required varies during the loading, scanning, and unloading of the thermal print media and the dye donor materials. With no media loaded on the vacuum imaging drum, the internal vacuum level of the vacuum imaging drum is approximately 10–15 inches of water (18.7–28.05 mm of mercury). With the thermal print media loaded on the vacuum imaging drum, the internal vacuum level of the vacuum imaging drum is approximately 20–25 inches of water (37.4–46.75 mm of mercury). This level is required when a dye donor is material is removed, otherwise the thermal print media may move and color-to-color registration will not be maintained as sheets of dye donor material are changed. With both the thermal print media and dye donor material completely loaded on the vacuum imaging drum, the internal vacuum level of the vacuum imaging drum is approximately 50–60 inches of water (93.5–112.2 mm of mercury).

The outer surface of the vacuum imaging drum is provided with an axially extending flat, which extends approximately 8° around the vacuum imaging drum circumference. The vacuum imaging drum is also provided with a circumferential recess which extends circumferentially from one side of the axially extending flat circumferentially around the vacuum imaging drum to the other side of the axially extending flat, and from approximately one inch (25.4 mm) from one end to approximately one inch (25.4 mm) from the other end of the vacuum imaging drum. The thermal print media, when mounted on the vacuum imaging drum, is seated in the circumferential recess. The circumferential recess has a depth substantially equal to the thermal print media thickness, approximately 0.004 inches (0.102 mm).

The purpose of the circumferential recess on the vacuum imaging drum surface is to eliminate any creases in the dye donor material as it is drawn down over the thermal print media during loading. This assures that no folds or creases will be generated in the dye donor material which could extend into the image area which would adversely affect the intended image. The circumferential recess also substantially eliminates the entrapment of air along the edge of the thermal print media where it is difficult for the vacuum holes in the vacuum imaging drum surface to assure the removal of the entrapped air. Any residual air between the thermal print media and the dye donor material can also adversely affect the intended image.

The purpose of the vacuum imaging drum axially extending flat assures that the leading and trailing ends of the dye donor material are protected from the effects of air turbulence during high speed rotation of the vacuum imaging drum during imaging process. Without the axially extending flat, the air turbulence would tend to lift the leading or trailing edge of the dye donor material. The vacuum imaging drum axially extending flat also ensures that the leading and trailing ends of the dye donor material are recessed from the vacuum imaging drum periphery. This reduces the chance of the dye donor material contacting other parts of the image processing apparatus, such as the printhead, which may cause a jam, loss of the intended image, or catastrophic damage to the image processing apparatus.

The task of loading and unloading the dye donor material on the vacuum imaging drum requires precise positioning of thermal print media and the dye donor materials. The lead edge positioning of dye donor material must be accurately controlled during this process. The existing image processing apparatus design employs a multi-chambered vacuum imaging drum for such lead edge control. One chamber applies vacuum to hold the leading edge of the dye donor material. Another chamber, separately valved, controls vacuum which holds the trailing edge of the thermal print media to the vacuum imaging drum. With this arrangement, loading a sheet of thermal print media and dye donor material requires that the image processing apparatus feed the lead edge of the thermal print media and dye donor material into position just past the vacuum ports controlled by the respective valved chamber. As vacuum is applied, the leading edge of the a dye donor material is pulled against the vacuum imaging drum surface.

Unloading the dye donor material, or the thermal print media, requires removal of vacuum from these same chambers so that an edge of the thermal print media, or the dye donor material, is freed and projects out from the surface of the vacuum imaging drum. The image processing apparatus then positions an articulating skive into the path of the free edge to lift the edge and to feed the dye donor material to a waste bin or the thermal print media to an output tray.

The sheet material exit transports consist of a dye donor material waste exit and the imaged thermal print media sheet material exit. The dye donor material exit transport comprises a waste dye donor material stripper blade disposed adjacent the upper surface of the vacuum imaging drum. In the unload position, the stripper blade is in contact with the waste dye donor material on the vacuum imaging drum surface. When not in operation, the stripper blade is moved up and away from the surface of the vacuum imaging drum. A driven waste dye donor material transport belt is arranged horizontally to carry the waste dye donor material which is removed by the stripper blade from the surface of the vacuum imaging drum to an exit formed in the exterior of the image processing apparatus. A waste bin for the waste dye donor materials is separate from the image processing apparatus. The imaged thermal print media sheet material exit transport comprises a movable thermal print media sheet material stripper blade that is disposed adjacent to the upper surface of the vacuum imaging drum. In the unload position, the stepper blade is in contact with the imaged thermal print media on the vacuum imaging drum surface. In the inoperative position, it is moved up and away from the surface of the vacuum imaging drum. A driven thermal print media sheet material transport belt is arranged horizontally to carry the imaged thermal print media removed by the stripper blade from the surface of the vacuum imaging drum. It then delivers the imaged thermal print media with the intended image formed thereon to an exit tray in the exterior of the image processing apparatus.

Although the presently known and utilized color-proofing apparatus is satisfactory, a separate apparatus is needed to expose the imagesetter recording film. Use of a separate machine to produce imagesetter recording film for making printing plates is not efficient since two separate machines must be purchased and maintained. Thus, there is a need to expose imagesetter recording film on the same apparatus that generates contract proofs.

SUMMARY OF THE INVENTION

It is the object of the present invention to expose imagesetter recording film on the same apparatus used for color-proofing.

The present invention is directed to overcoming one or more of the problems set forth above. Briefly summarized, according to one aspect of the present invention, imagesetter recording film is exposed on a color-proofing apparatus by loading a sheet of support material on a vacuum imaging drum. The imagesetter recording film is loaded on the vacuum imaging drum in registration with the support material and an image is formed on the imagesetter recording film by removing dye from the imagesetter recording film.

According to another embodiment of the invention, an image processing apparatus comprises a vacuum imaging drum for holding a sheet of support material which fits in a circumferential recess on the surface of the vacuum imaging drum. Imagesetter recording film overlays the support material and a leading and trailing edge of the imagesetter recording film is on an axially extending flat. The support material is fed from a first roll, cut to length, loaded onto the vacuum drum and held in place with vacuum. The imagesetter recording film is fed from a second roll, cut to length, loaded onto the vacuum imaging drum, and held in place by vacuum. Because the dye or removable layer is facing away from the drum, a vacuum system removes the dye from the printhead area when the imagesetter film when it is exposed by the printhead.

There are a number of advantages to exposing imagesetter recording film on the same apparatus that is used to produce a color proof. Using the same image file from the same Raster Image Processor (RIP), fed through the same electronics to the same printhead, the imagesetter film is exposed using the same electrical and mechanical systems used to produce the color print. Thus, there is less chance for variations between the color proof, which has been approved by the customer, and the imagesetter recording film used to produce the plates.

It is an advantage of the present invention to expose imagesetter recording film using the same Raster Image Processor (RIP) file used to produce a four color contract image.

It is an advantage of the present invention to expose imagesetter recording film using the same writing electronics used to produce the four color contract image.

It is an advantage of the present invention to expose imagesetter recording film using the same printhead used to produce the four color contract image.

It is an advantage of the present invention to expose imagesetter recording film using the same media handling system used to produce the four color contract image.

It is an advantage of the present invention to expose imagesetter recording film using the same vacuum drum used to produce the four color contract image.

The above, and other objects, advantages, and novel features of the present invention will become more apparent from the accompanying detailed description thereof when considered in conjunction with the following drawings.

DETAILED DESCRIPTION OF THE INVENTION

The present description will be directed in particular to elements forming part of, or in cooperation more directly with the apparatus in accordance with the present invention. It is understood that elements not specifically shown or described may take various forms well-known to those skilled in the art.

Figure 1:
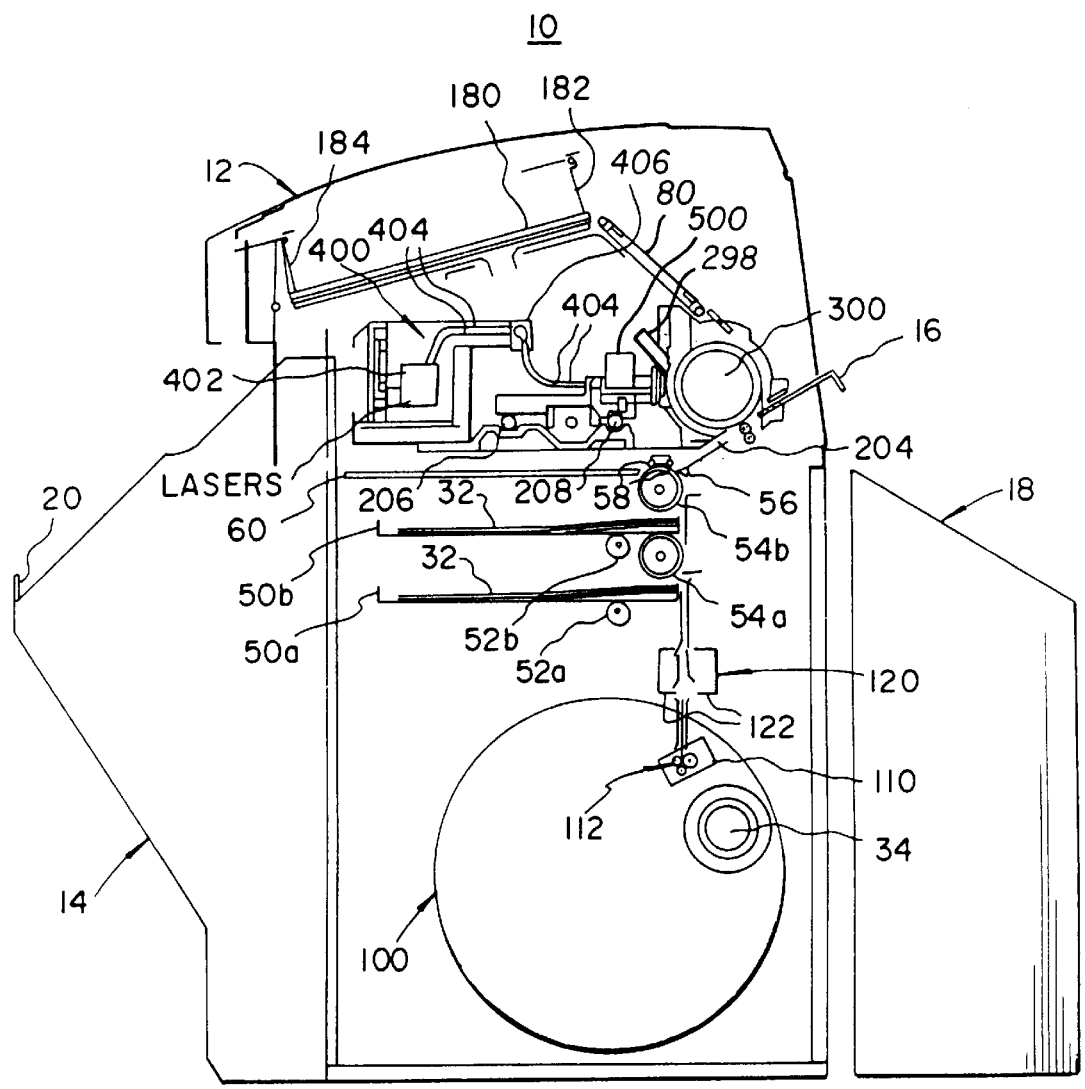
FIG. 1 is a side view in vertical cross-section of an image processing apparatus according to the present invention.

Referring to FIG. 1, there is illustrated an image processing apparatus 10 according to the present invention having an image processor housing 12 which provides a protective cover. A movable, hinged image processor door 14 is attached to the front portion of the image processor housing 12 permitting access to the two sheet material trays, lower sheet material tray 50a and upper sheet material tray 50b, positioned in the interior portion of the image processor housing 12 for supporting thermal print media 32. Only one of the sheet material trays 50 will dispense the thermal print media 32 out of its sheet material tray 50 to create an intended image, the alternate sheet material tray either holds an alternative type of thermal print media 32 or functions as a back up sheet material tray. In this regard, the lower sheet material tray 50a includes a lower media lift cam 52a for lifting the lower sheet material tray 50a and ultimately the thermal print media 32, upwardly toward a rotatable, lower media roller 54a and toward a second rotatable, upper media roller 54b, which when both are rotated, permits the thermal print media 32 to be pulled upwardly towards a media guide 56. The upper sheet material tray 50b includes a upper media lift cam 52b for lifting the upper sheet material tray 50b and ultimately the thermal print media 32 towards the upper media roller 54b which directs it towards the media guide 56.

The movable media guide 56 directs the thermal print media 32 under a pair of media guide rollers 58 which engages the thermal print media 32 for assisting the upper media roller 54b in directing it onto the media staging tray 60. The media guide 56 is attached and hinged to the lathe bed scanning frame 202 at one end, and is uninhibited at its other end for permitting multiple positioning of the media guide 56. The media guide 56 then rotates its uninhibited end downwardly, as illustrated in the position shown, and the direction of rotation of the upper media roller 54b is reversed for moving the thermal print medium receiver sheet material 32 resting on the media staging tray 60 under the pair of media guide rollers 58, upwardly through an entrance passageway 204 and around a rotatable vacuum imaging drum 300.

A roll 30 of dye donor material 34 is connected to the media carousel 100 in a lower portion of the image processor housing 12. Four rolls 30 are used, but only one is shown for clarity. Each roll 30 includes a dye donor material 34 of a different color, typically black, yellow, magenta and cyan.

Dye donor material 34 is ultimately cut into sheet 36 and passed to the vacuum imaging drum 300. Dyes imbedded in the dye donor material is passed to the thermal print media 32 resting on the vacuum imaging drum, described in more detail below. In this regard, a media drive mechanism 110 is attached to each roll of dye donor material 34, and includes three media drive rollers 112 through which the dye donor material 34 of interest is metered upwardly into a media knife assembly 120. After the dye donor material 34 reaches a predetermined position, the media drive rollers 112 cease driving the dye donor material 34 and the two media knife blades 122 positioned at the bottom portion of the media knife assembly 120 cut the dye donor material 34 into sheets of dye donor materials 36. The lower media roller 54a and the upper media roller 54b along with the media guide 56 then pass the dye donor material onto the media staging tray 60 and ultimately to the vacuum imaging drum 300 and in registration with the thermal print media 32 using the same process as described above for passing the thermal print media 32 onto the vacuum imaging drum 300. The dye donor material now rests atop the thermal print media 32 with a narrow gap between the two created by microbeads imbedded in the surface of the thermal print media 32.

A laser assembly 400 includes a quantity of laser diodes 402, the lasers 402 are connected via fiber optic cables 404 to a distribution block 406 and ultimately to the printhead 500. The printhead 500 directs thermal energy received from the laser diodes 402 causing the dye donor material to pass the desired color across the gap to the thermal print media 32. The printhead 500 is attached to a lead screw 250 via the lead screw drive nut 254 and drive coupling 256 (not shown in FIG. 1) allowing axial movement along the longitudinal axis of the vacuum imaging drum 300 for transferring the data to create the intended image onto the thermal print media 32.

For writing, the vacuum imaging drum 300 rotates at a constant velocity, and the printhead 500 begins at one end of the thermal print media 32 and traverse the entire length of the thermal print media 32 for completing the transfer process for the particular of sheet of dye donor material 36, shown in FIG. 6, resting on the thermal print media 32. After the printhead 500 has completed the transfer process, the sheet of dye donor material 36 is removed from the vacuum imaging drum 300 and transferred out the image processor housing 12 via a skive or ejection chute 16. The sheet of dye donor material 36 eventually comes to rest in a waste bin 18 for removal by the user. The above-described process is then repeated for three other rolls 30 of dye donor materials 34.

After the color from all four sheets of the dye donor materials 36 have been transferred and the sheets of dye donor materials 36 have been removed from the vacuum imaging drum 300, the thermal print media 32 is removed from the vacuum imaging drum 300 and transported via a transport mechanism 80 to a color binding assembly 180. The entrance door 182 of the color binding assembly 180 is opened for permitting the thermal print media 32 to enter the color binding assembly 180, and shuts once the thermal print media 32 comes to rest in the color binding assembly 180. The color binding assembly 180 processes the thermal print media 32 for further binding the transferred colors on the thermal print media 32 and for sealing the microbeads thereon. After the color binding process has been completed, the media exit door 184 is opened and the thermal print media 32 with the intended image thereon passes out of the color binding assembly 180 and the image processor housing 12 and comes to rest against a media stop 20.

Figure 2:
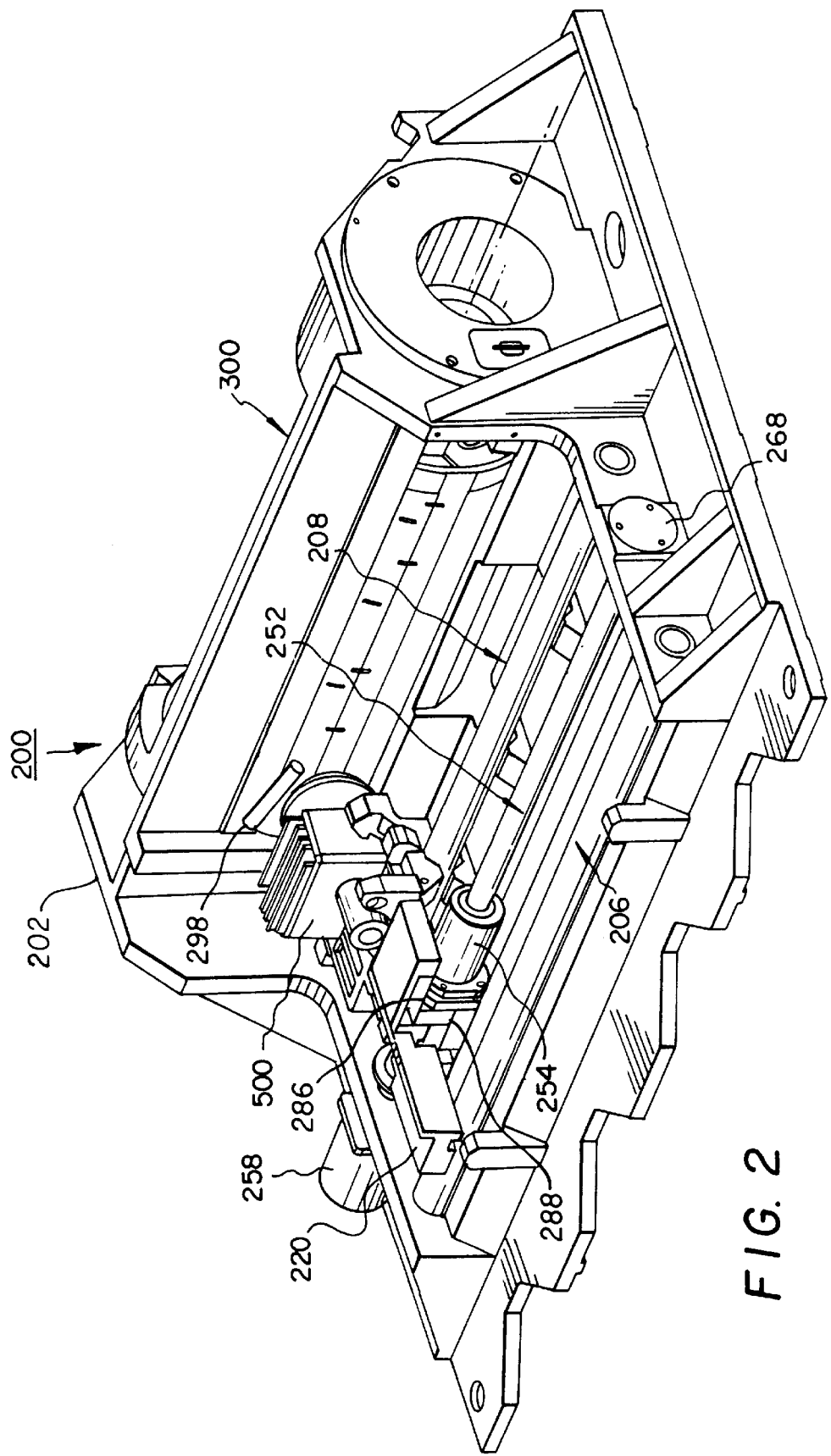
FIG. 2 is a perspective view of a lathe bed scanning subsystem of the present invention.

Referring to FIG. 2, there is illustrated a perspective view of the lathe bed scanning subsystem 200 of the image processing apparatus 10, including the vacuum imaging drum 300, printhead 500 and lead screw 250 assembled in the lathe bed scanning frame 202. The vacuum imaging drum 300 is mounted for rotation about an axis X in the lathe bed scanning frame 202. The printhead 500 is movable with respect to the vacuum imaging drum 300, and is arranged to direct a beam of light to the dye donor material 36. The beam of light from the printhead 500 for each laser diode 402 (not shown in FIG. 2) is modulated individually by modulated electronic signals from the image processing apparatus 10, which are representative of the shape and color of the original image, so that the color on the dye donor material 36 is heated to cause volatilization only in those areas in which its presence is required on the thermal print media 32 to reconstruct the shape and color of the original image.

The printhead 500 is mounted on a movable translation stage member 220 which in turn is supported for low friction slidable movement on translation bearing rods 206 and 208. The translation bearing rods 206 and 208 are sufficiently rigid so that they do not sag or distort between their mounting points and are arranged as parallel as possible with the axis X of the vacuum imaging drum 300 with the axis of the printhead 500 perpendicular to the axis X of the vacuum imaging drum 300 axis. The front translation bearing rod 208 locates the translation stage member 220 in the vertical and the horizontal directions with respect to axis X of the vacuum imaging drum 300. The rear translation bearing rod 206 locates the translation stage member 220 only with respect to rotation of the translation stage member 220 about the front translation bearing rod 208 so that there is no over-constraint condition of the translation stage member 220 which might cause it to bind, chatter, or otherwise impart undesirable vibration or jitters to the printhead 500 during the generation of an intended image.

Figure 3:
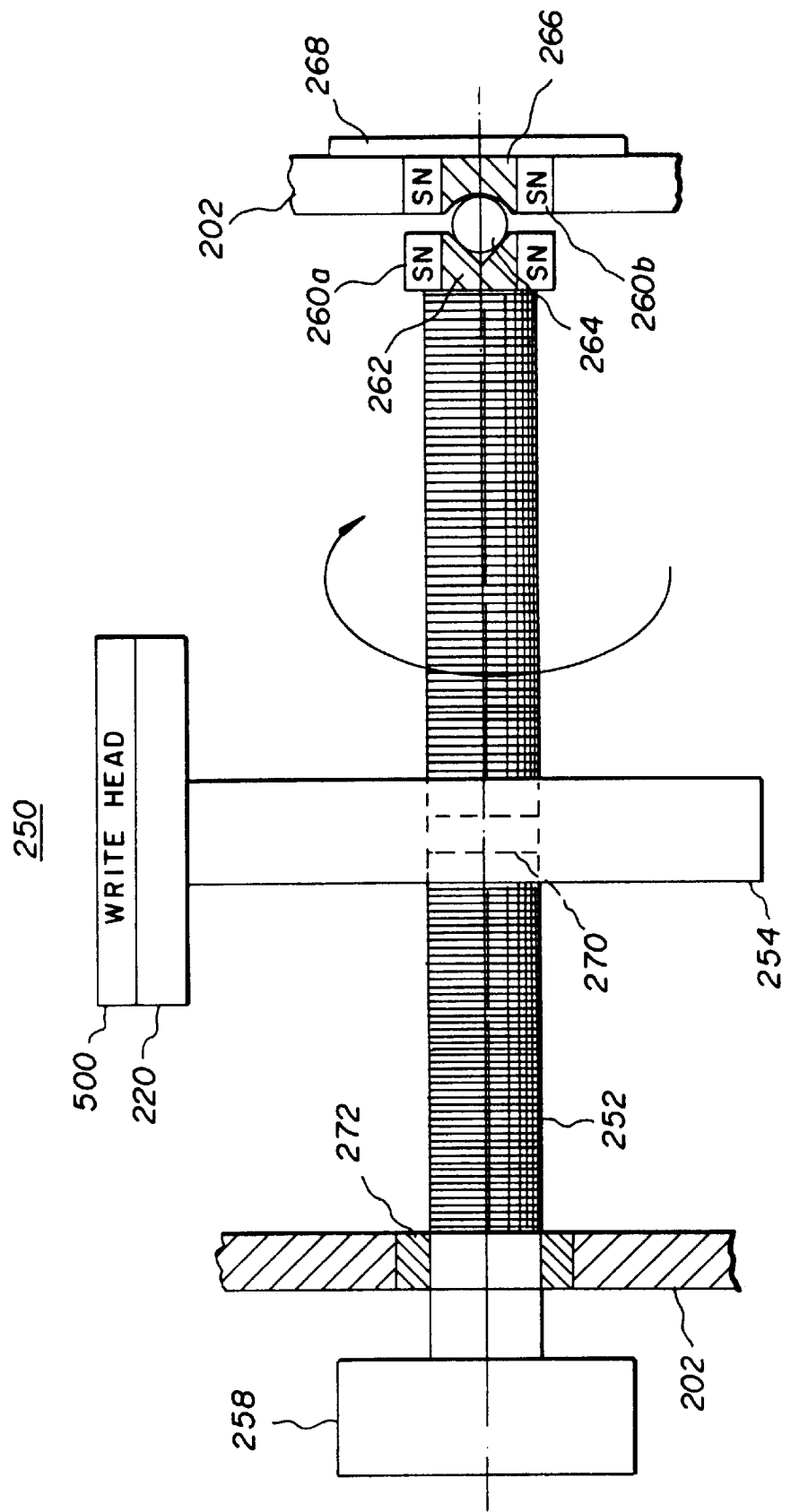
FIG. 3 is a top view in horizontal cross-section, partially in phantom, of the lead screw according to the present invention.

Referring to FIGS. 2 and 3, a lead screw 250 is shown which includes an elongated, threaded shaft 252 which is attached to the linear drive motor 258 on its drive end and to the lathe bed scanning frame 202 by means of a radial bearing 272. A lead screw drive nut 254 includes grooves in its hollowed-out center portion 270 for mating with the threads of the threaded shaft 252 for permitting the lead screw drive nut 254 to move axially along the threaded shaft 252 as the threaded shaft 252 is rotated by the linear drive motor 258. The lead screw drive nut 254 is integrally attached to the printhead 500 through the lead screw coupling 256 (not shown) and the translation stage member 220 at its periphery so that as the threaded shaft 252 is rotated by the linear drive motor 258 and the lead screw drive nut 254 moves axially along the threaded shaft 252 which in turn moves the translation stage member 220 and ultimately the printhead 500 axially along the vacuum imaging drum 300.

As best illustrated in FIG. 3, an annular-shaped axial load magnet 260a is integrally attached to the non-driven end of the threaded shaft 252, and is in a spaced apart relationship with another annular-shaped axial load magnet 260b attached to the lathe bed scanning frame 202. The axial load magnets 260a and 260b are preferably made of rare earth materials such as neodymium-iron-boron. A generally circular-shaped boss 262 part of the threaded shaft 252 rests in the hollowed-out portion of the annular-shaped axial load magnet 260a, and includes a generally V-shaped surface at the end for receiving a ball bearing 264. A circular-shaped insert 266 is placed in the hollowed-out portion of the other annular-shaped axial load magnet 260b, and includes an accurate-shaped surface on one end for receiving the ball bearing 264, and a flat surface at its other end for receiving an end cap 268 placed over the annular-shaped axial load magnet 260b and attached to the lathe bed scanning frame 202 for protectively covering the annular-shaped axial load magnet 260b and providing an axial stop for the lead screw 250. The circular shaped insert 266 is preferably made of material such as Rulon J™ or Delrin AF™, both of which are well known in the art.

The linear drive motor 258 imparts rotation to the lead screw 250, as indicated by the arrows, causing the lead screw drive nut 254 to move axially along the threaded shaft 252. The annular-shaped axial load magnets 260a and 260b are magnetically attracted to each other which prevents axial movement of the lead screw 250. The ball bearing 264, however, permits rotation of the lead screw 250 while maintaining the positional relationship of the annular-shaped axial load magnets 260, i.e., slightly spaced apart, which prevents mechanical friction between them while obviously permitting the threaded shaft 252 to rotate.

The printhead 500 travels in a path along the vacuum imaging drum 300, moving at a speed synchronous with the vacuum imaging drum 300 rotation, and proportional to the width of the writing swath 450, not shown. The pattern that the printhead 500 transfers to the thermal print media 32 along the vacuum imaging drum 300 is a helix.

Figure 4:
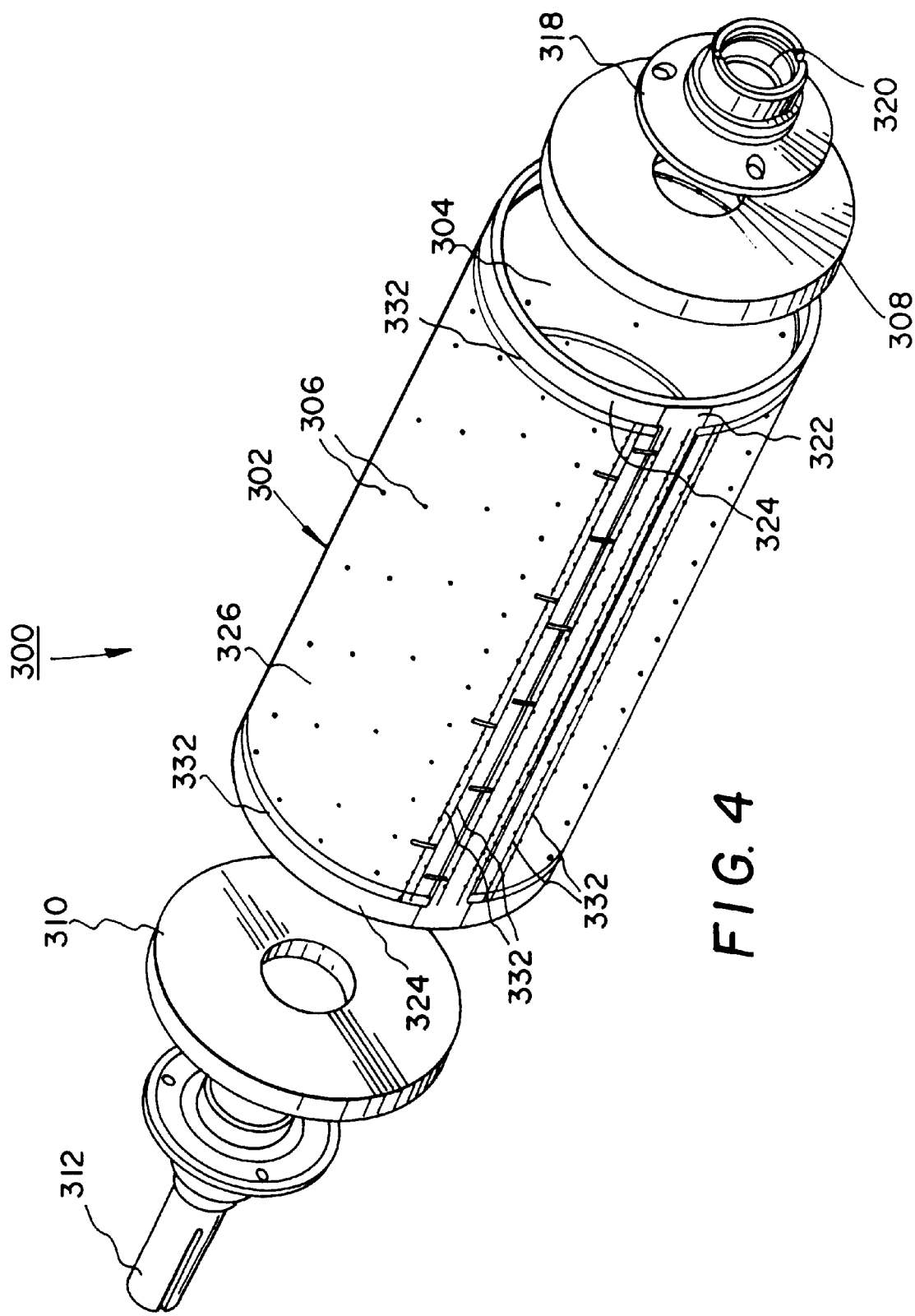
FIG. 4 is a exploded, perspective view of a vacuum imaging drum according to the present invention.

FIG. 4 shows an exploded view of the vacuum imaging drum 300. The vacuum imaging drum 300 has a cylindrical shaped vacuum drum housing 302 that has a hollowed-out interior portion 304, and includes a plurality of vacuum grooves 332 and vacuum holes 306 which extend through the vacuum drum housing 302 for supplying a vacuum to the vacuum imaging drum 300 surface for supporting and maintaining the position of the thermal print media 32, and the dye donor material 36, as the vacuum imaging drum 300 rotates.

The ends of the vacuum imaging drum 300 are closed by the vacuum end plate 308, and the drive end plate 310. The drive end plate 310, is provided with a centrally disposed drive spindle 312 which extends outwardly therefrom through a support bearing, the vacuum end plate 308 is provided with a centrally disposed vacuum spindle 318 which extends outwardly therefrom through another support bearing.

The drive spindle 312 extends through the support bearing and is stepped down to receive a DC drive motor armature (not shown), which is held on by means of a drive nut (not shown). A DC motor stator (not shown) is stationary held by the late bed scanning frame member 202, encircling the DC drive motor armature to form a reversible, variable DC drive motor for the vacuum imaging drum 300. At the end of the drive spindle 312 a drum encoder (not shown) is mounted to provide the timing signals to the image processing apparatus 10.

The vacuum spindle 318 is provided with a central vacuum opening 320 which is in alignment with a vacuum fitting (not shown) with an external flange that is rigidly mounted to the lathe bed scanning frame 202. The vacuum fitting has an extension which extends within, but is closely spaced from the vacuum spindle 318, thus forming a small clearance. With this configuration, a slight vacuum leak is provided between the outer diameter of the vacuum fitting and the inner diameter of the central vacuum opening 320 of the vacuum spindle 318. This assures that no contact exists between the vacuum fitting and the vacuum imaging drum 300 which might impart uneven movement or jitters to the vacuum imaging drum 300 during its rotation.

The opposite end of the vacuum fitting is connected to a high-volume vacuum blower (not shown) which is capable of producing 50–60 inches of water (93.5–112.3 mm of mercury) at an air flow volume of 60–70 cfm (28.368–33.096 liters/sec). And provides the vacuum to the vacuum imaging drum 300 supporting the various internal vacuum levels of the vacuum imaging drum 300 required during the loading, scanning and unloading of the thermal print media 32 and the dye donor materials 36 to create the intended image. With no media loaded on the vacuum imaging drum 300, the internal vacuum level of the vacuum imaging drum 300 is approximately 10–15 inches of water (18.7–28.05 mm of mercury). With just the thermal print media 32 loaded on the vacuum imaging drum 300, the internal vacuum level of the vacuum imaging drum 300 is approximately 20–25 inches of water (37.4–46.75 mm of mercury). This level is required such that when a dye donor material 36 is removed, the thermal print media 32 does not move, otherwise color-to-color registration will be able to be maintained. With both the thermal print media 32 and dye donor material 36 completely loaded on the vacuum imaging drum 300, the internal vacuum level of the vacuum imaging drum 300 is approximately 50–60 inches of water (93.5–112.2 mm of mercury) in this configuration.

Figure 5:
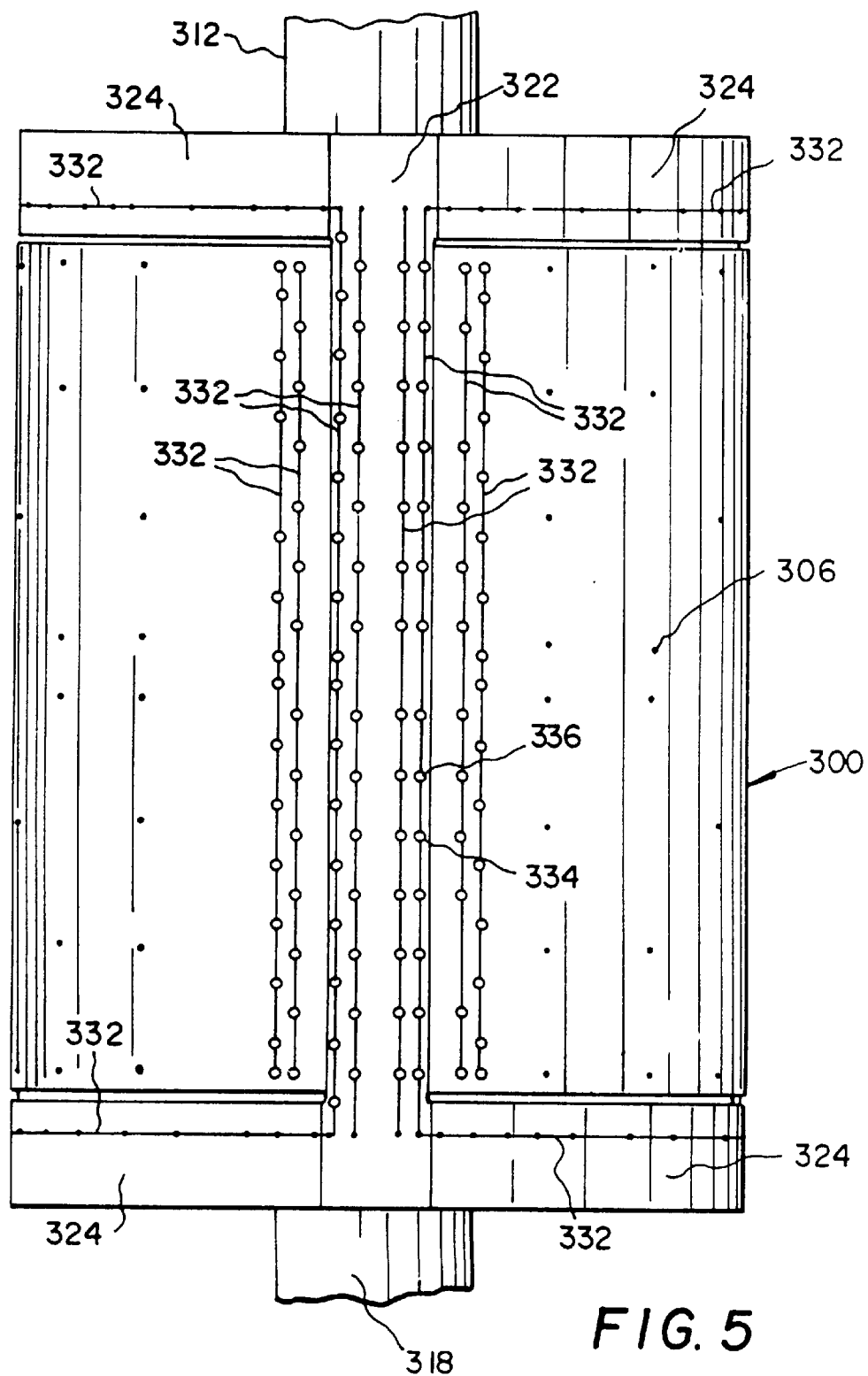
FIG. 5 is a plane view of a surface of the vacuum imaging drum according to the present invention.

The outer surface of the vacuum imaging drum 300 is provided with an axially extending flat 322, shown FIGS. 4 and 5, which extends over approximately 8° of the vacuum imaging drum 300 circumference. The vacuum imaging drum 300 is also provided with donor support rings 324 which form a circumferential recess 326, which extends circumferentially from one side of the axially extending flat 322 circumferentially around the vacuum imaging drum 300 to the other side of the axially extending flat 322, and from approximately one inch (25.4 mm) from one end of the vacuum imaging drum 300 to approximately one inch (25.4 mm) from the other end of the vacuum imaging drum 300.

Figure 6A:
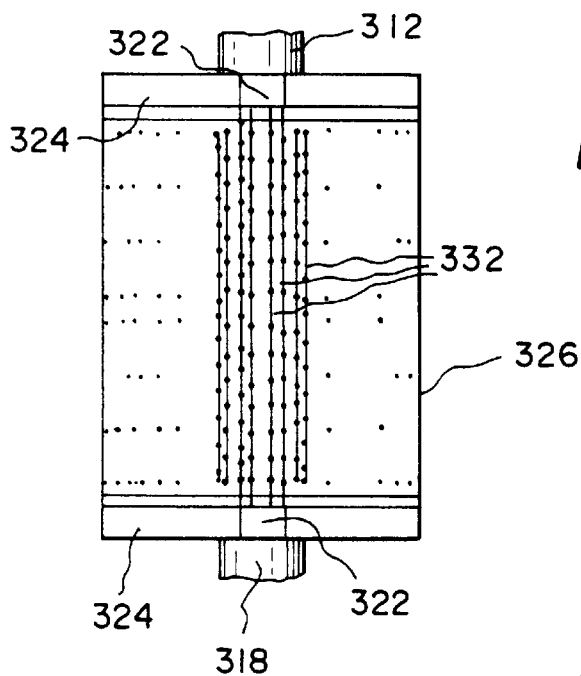
FIGS. 6a–6c is a plane view of the vacuum imaging drum showing the sequence of placement for thermal print media and dye donor material.
Figure 6B:
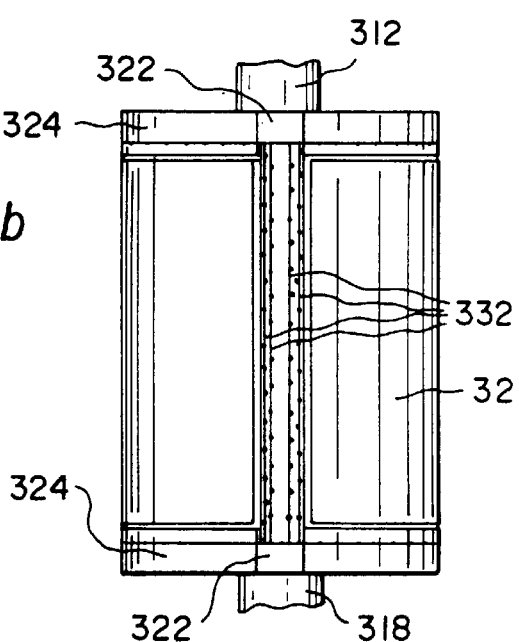
Figure 6C:
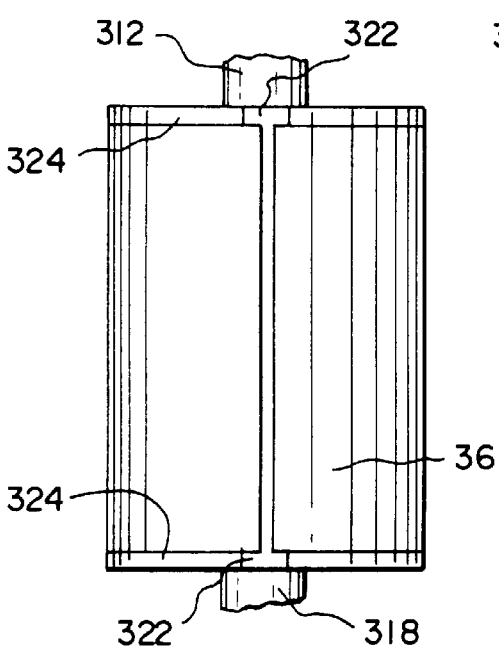

The thermal print media 32 is mounted on the vacuum imaging drum 300 seated within the circumferential recess 326, and between the donor support rings 324, as shown FIGS. 6a–6c. The thickness of the circumferential recess 326 is equal to the thermal print media 32 thickness, which is approximately 0.004 inches (0.102 mm). The purpose of the circumferential recess 326 on the vacuum imaging drum 300 surface is to eliminate any creases in the sheets of dye donor material 36 as they are drawn down over the thermal print media 32 during the loading of the dye donor material 36. This ensures that no folds or creases will be generated in the dye donor material 36 which could extend into the image area and seriously adversely affect the intended image. The circumferential recess 326 also substantially eliminates the entrapment of air along the edge of the thermal print media 32, where it is difficult for the vacuum holes 306 in the vacuum imaging drum 300 surface to assure the removal of the entrapped air. Any residual air between the thermal print media 32 and the dye donor material 36 can also adversely affect the intended image.

Figure 9:
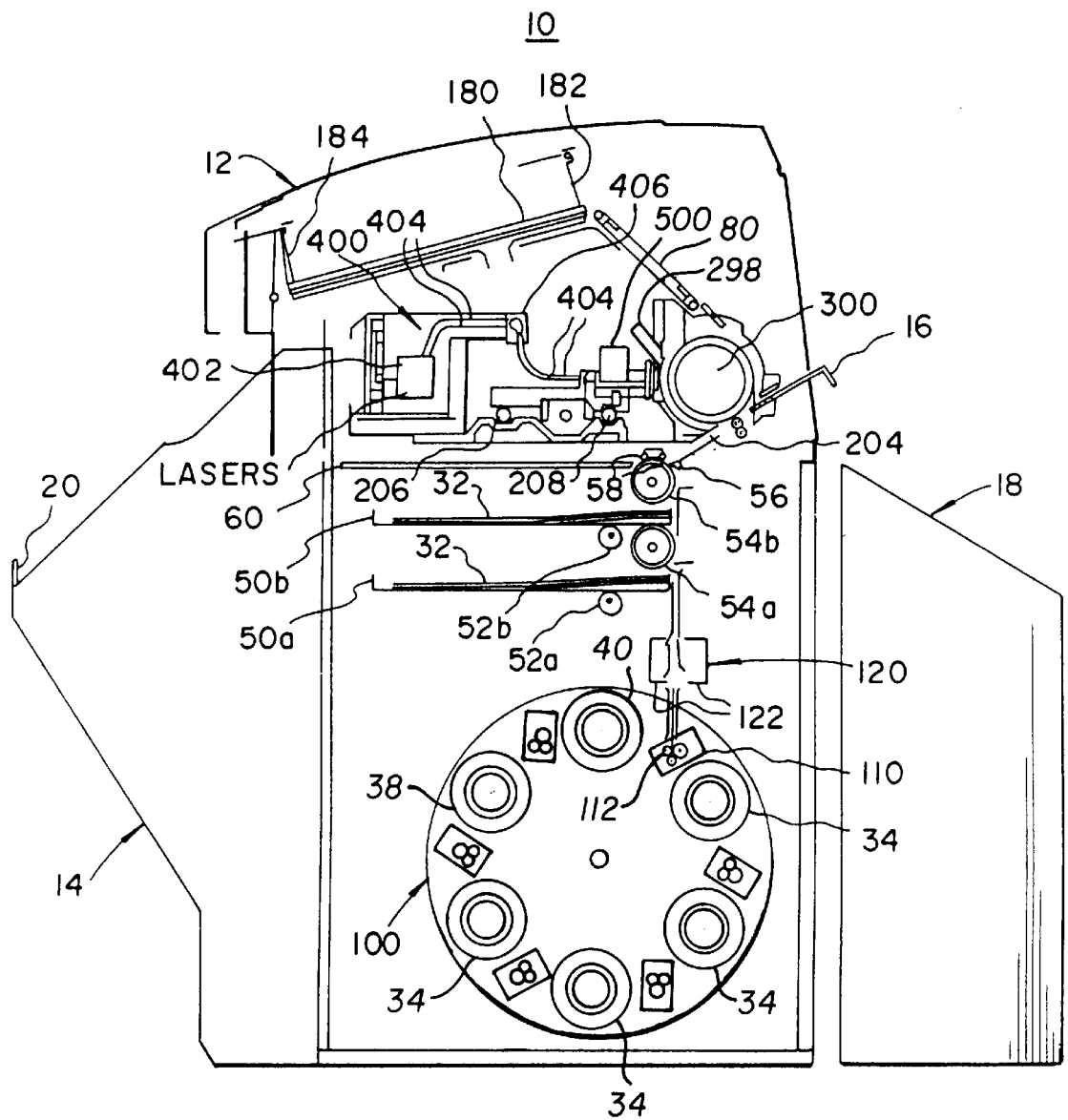
FIG. 9 is a side view in vertical cross-section of an image processing apparatus according to the present invention with a carousel with support material roll and imagesetter film roll.

When using the color-proofer as an imagesetter, support material 38 and imagesetter film 40 are mounted in the media carousel 100 located in the lower portion of the image processor housing 12, shown in FIG. 9. Up to six rolls can be mounted in the carousel. In the present invention, four rolls of dye donor material 34, each a different color, typically black, yellow, magenta and cyan, are mounted. A roll of support 38 material and a roll of imagesetter film 40 are also mounted in the carousel.

Figure 7:
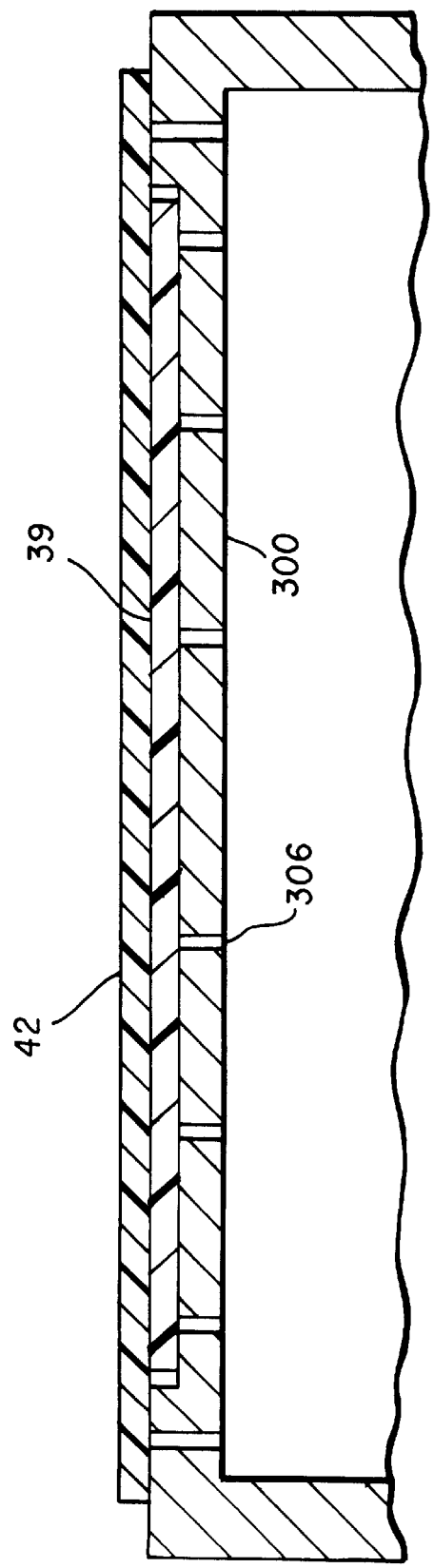
FIG. 7 is a partial section view of the vacuum imaging drum with support material and imagesetter film.

The support material 38 and imagesetter film 40 are ultimately cut into support material sheets 39 and imagesetter film sheets 42 and mounted on the vacuum imaging drum 300 as shown in FIG. 7. Referring again to FIG. 9, a media drive mechanism 110 is attached to a roll 30 of the support material 38, and includes three media drive rollers 112 through which support material 38 of interest is metered upwardly into a media knife assembly 120. After the support material 38 reaches a predetermined position, the media drive rollers 112 cease driving the support material 38 and the two media knife blades 122 positioned at the bottom portion of the media knife assembly 120 cut the support material 38 into support material sheets 39. The lower media roller 54b and the upper media roller 54a, along with the media guide 56, then pass the support material sheets 39 onto the media staging tray 60 and ultimately to the vacuum imaging drum 300 using the same process as described above for passing the thermal print media 32 onto the vacuum imaging drum 300.

The media drive mechanism 110 is attached to a roll of the imagesetter film 40 and includes three media drive rollers 112 through which imagesetter film 40 of interest is metered upwardly into a media knife assembly 120. After imagesetter film 40 reaches a predetermined position, the media drive rollers 112 cease driving the imagesetter film 40 and the two media knife blades 122 positioned at the bottom portion of the media knife assembly 120 cut the imagesetter film 40 into imagesetter film sheets 42. The lower media roller 54a and the upper media roller 54b along with the media guide 56 then pass the imagesetter film sheet 42 onto the media staging tray 60 and ultimately to the vacuum imaging drum 300 using the same process as described above for passing the thermal print media 32 onto the vacuum imaging drum 300.

The printhead 500 directs thermal energy received from the laser diodes 402 causing the dye on the imagesetter film sheet 42 to be removed. The dye is then removed from the area in front of the printhead 500 by a vacuum nozzle 298, shown in FIGS. 1 and 2. The printhead 500 is attached to a lead screw 250 via the lead screw drive nut 254 and drive coupling 256 (not shown in FIG. 1) for permitting movement axially along the longitudinal axis of the vacuum imaging drum 300 for transferring the data to create the intended image onto the imagesetter film sheet 42. The intended image is created on the imagesetter film 42 using the same process described above.

When the first imagesetter film sheet 42 is completed, it is then removed from the vacuum imaging drum 300 and transported via a transport mechanism 80 to a color binding assembly 180. The entrance door 182 of the color binding assembly 180 is opened for permitting the imagesetter film sheet 42 to enter the color binding assembly 180. The imagesetter film sheet 42 is post-baked at this point for stabilization of the image on the imagesetter film sheet 42. The media exit door 184 is opened and the imagesetter film sheet 42 with the intended image thereon passes out of the color binding assembly 180 and the image processor housing 12 and comes to rest against a media stop 20. A second sheet is loaded over the support material sheet 39 and imaged. Alternatively, support material sheet 39 can be transferred out the image processor housing 12 via a skive or ejection chute 16. The support material sheet 39 eventually comes to rest in a waste bin 18 for removal by the user.

Figure 8A:
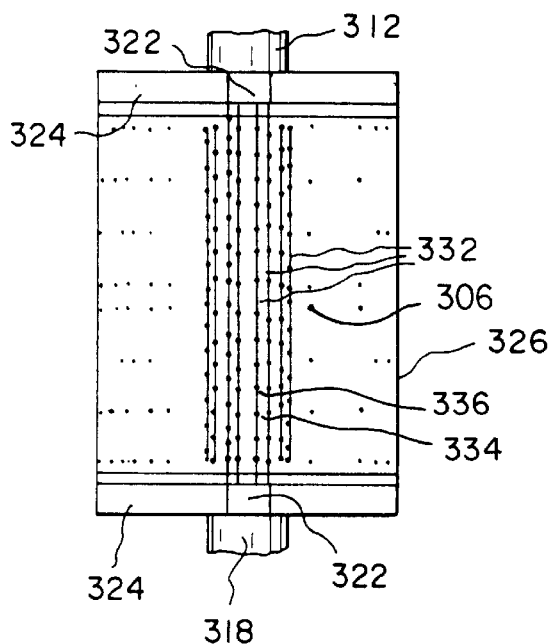
FIGS. 8a–8c is a plane view of the vacuum imaging drum showing the sequence of placement for support material and imagesetter film.
Figure 8B:
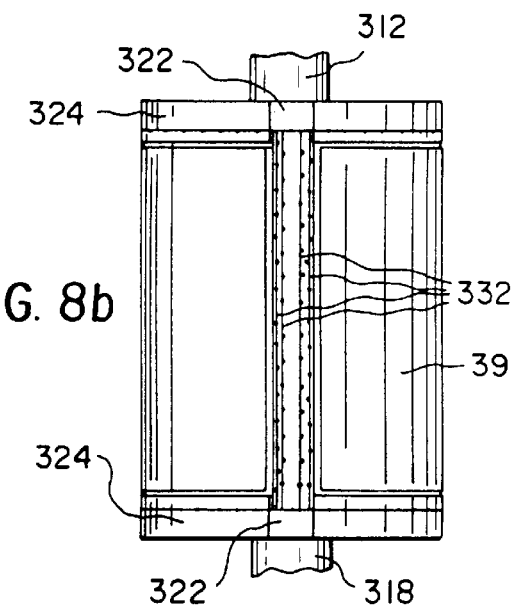
Figure 8C:
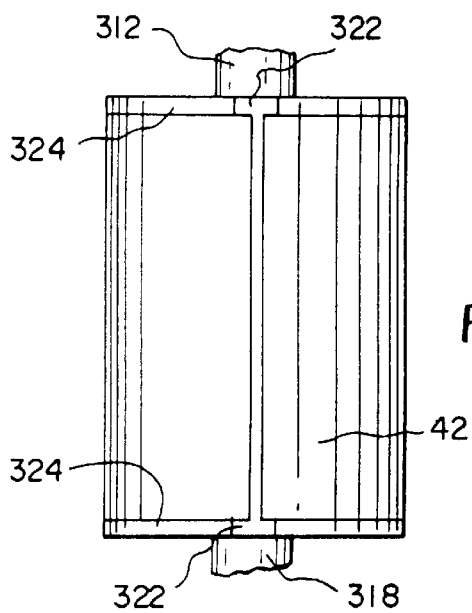

The support material sheet 39, when mounted on the vacuum imaging drum, is seated within the circumferential recess 326 (as shown FIGS. 8a–8c). The donor support rings 324 have a thickness substantially equal to the support material sheet 39 thickness, approximately 0.004 inches (0.102 mm) in thickness. The purpose of the circumferential recess 326 on the vacuum imaging drum 300 surface is to eliminate any creases in the imagesetter film sheet 42, as they are drawn down over the support material 39 during the loading of the imagesetter film sheet 42. This ensures that no folds or creases will be generated in the imagesetter film sheet 42 which could extend into the image area and seriously adversely affect the intended image. The circumferential recess 326 also substantially eliminates the entrapment of air along the edge of the sheet of support material 39 where it is difficult for the vacuum holes 306 in the vacuum imaging drum 300 surface to assure the removal of the entrapped air. Any residual air between the support material sheet 39 and the imagesetter film sheet 42 can also adversely affect the intended image.

Figure 10:
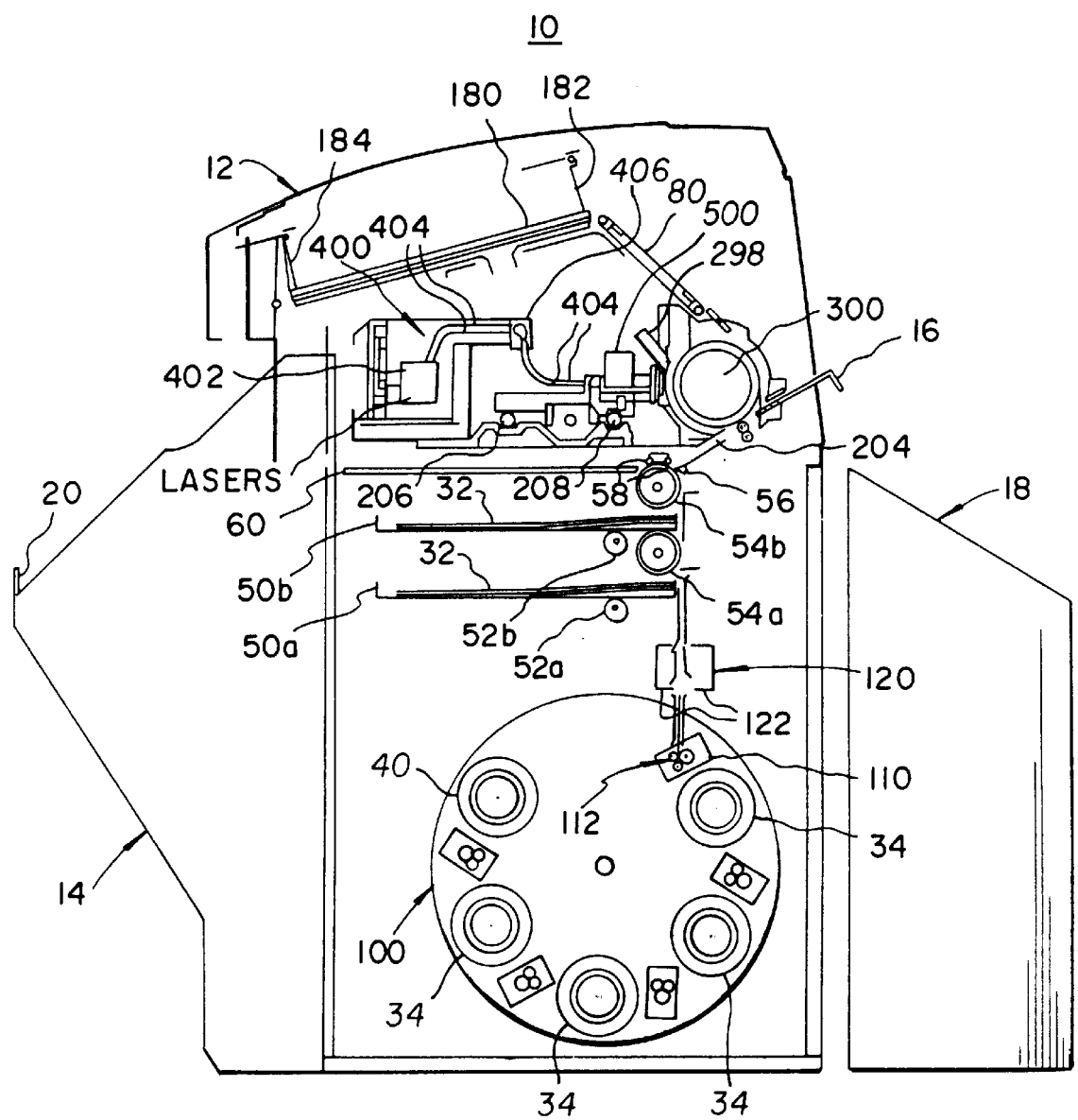
FIG. 10 is a side view in vertical cross-section of an image processing apparatus according to the present invention with sheets of support material loaded in a tray.

The invention has been described with reference to the preferred embodiment thereof. However, it will be appreciated and understood that variations and modifications can be effected within the spirit and scope of the invention as described herein above and as defined in the appended claims by a person of ordinary skill in the art without departing from the scope of the invention. For example, during proofing, the support material could be exited from the drum after imaging the imagesetter film and stored in a holding tray for reuse. Also, the support material in sheet form 39 could be loaded from the alternate media tray 50a, as shown in FIG. 10. Although the term "dye" has been used throughout the detailed description, other material could be used for the transfer of images to the thermal print media, or to the imagesetter recording film. Such material includes, but is not limited to, pigments, ink, or wax transfer.

| PARTS LIST | |
|---|---|
| 10. | Image processing apparatus |
| 12. | Image processor housing |
| 14. | Image processor door |
| 16. | Donor ejection chute |
| 18. | Donor waste bin |
| 20. | Media stop |
| 30. | Roll media |
| 32. | Thermal print media |
| 34. | Dye donor roll material |
| 36. | Dye donor material |
| 38. | Support material roll material |
| 39. | Support material sheet material |
| 40. | Imagesetter Film roll material |
| 42. | Imagesetter Film sheet material |
| 50. | Sheet material trays |
| 50a. | Lower sheet material tray |
| 50b. | Upper sheet material tray |
| 52. | Media lift cams |
| 52a. | Lower media lift cam |
| 52b. | Upper media lift cam |
| 54. | Media rollers |
| 54a. | Lower media roller |
| 54b. | Upper media roller |
| 56. | Media guide |
| 58. | Media guide rollers |
| 60. | Media staging tray |
| 80. | Transport mechanism |
| 100. | Media carousel |
| 110. | Media drive mechanism |
| 112. | Media drive rollers |
| 120. | Media knife assembly |
| 122. | Media knife blades |
| 180. | Color binding assembly |
| 182. | Media entrance door |
| 184. | Media exit door |
| 200. | Lathe bed scanning subsystem |
| 202. | Lathe bed scanning frame |
| 204. | Entrance passageway |
| 206. | Rear translation bearing rod |
| 208. | Front translation bearing rod |
| 220. | Translation stage member |
| 250. | Lead screw |

-continued

PARTS LIST

| | |
|---|---|
| 252. | Threaded shaft |
| 254. | Lead screw drive nut |
| 256. | Drive coupling |
| 258. | Linear drive motor |
| 260. | Axial load magnets |
| 260a. | Axial load magnet |
| 260b. | Axial load magnet |
| 262. | Circular-shaped boss |
| 264. | Ball bearing |
| 266. | Circular-shaped insert |
| 268. | End cap |
| 270. | Hollowed-out center portion |
| 298. | Vacuum nozzle |
| 300. | Vacuum imaging drum |
| 302. | Vacuum drum housing |
| 304. | Hollowed out interior portion |
| 306. | Vacuum hole |
| 308. | Vacuum end plate |
| 310. | Drive end plate |
| 312. | Drive spindle |
| 318. | Vacuum spindle |
| 320. | Central vacuum opening |
| 322. | Axially extending flat |
| 324. | Donor support ring |
| 326. | Circumferential recess |
| 332. | Vacuum grooves |
| 400. | Laser assembly |
| 402. | Lasers diode |
| 404. | Fiber optic cables |
| 406. | Distribution block |
| 454. | Optical centerline |
| 500. | Printhead |

What is claimed is:

1. A method of exposing imagesetter recording film on a color-proofing apparatus comprising the steps of:
   loading a sheet of support material on a vacuum imaging drum;
   loading a sheet of said imagesetter recording film in registration with said support material on said vacuum imaging drum; and
   forming an intended image on said imagesetter recording film by removing dye from said imagesetter recording film.

2. The method of exposing imagesetter recording film as in claim 1 wherein said dye is removed by ablating said dye.

3. The method of exposing imagesetter recording film as in claim 2 comprising the additional step of vacuuming said ablated dye as said intended image is formed.

4. The method of exposing imagesetter recording film as in claim 1 wherein said imagesetter recording film is stored as a roll and cut into sheets.

5. The method of exposing imagesetter recording film as in claim 1 wherein said support material is stored on a roll and cut into sheets.

6. The method of exposing imagesetter recording film as in claim 1 wherein said support material is stored in sheet form in a tray.

7. The method of exposing imagesetter recording film as in claim 1, wherein said step of forming said intended image comprises the step of applying thermal energy by way of a printhead to said imagesetter recording film to remove dye from said imagesetter recording film.

8. The method of exposing imagesetter recording film according to claim 7, comprising the further step of:
   the dye removed from said imagesetter film from an area in front of the printhead by way of a vacuum nozzle.

9. A method of exposing imagesetter recording film according to claim 8, comprising the further step of: vacuuming the dye removed from said imagesetter film from an area in front of the printhead by way of a vacuum nozzle.

10. The method of exposing imagesetter recording film on a color-proofing apparatus comprising the steps of:
    loading a sheet of thermal print media on a vacuum imaging drum;
    loading at least one sheet of dye donor material in registration with said thermal print media on said vacuum imaging drum;
    forming an intended image on said thermal print media by transferring dye from said dye donor material to said thermal print media;
    removing said dye donor material;
    removing said thermal print media;
    loading a sheet of support material on said vacuum imaging drum;
    loading a sheet of imagesetter recording film in registration with said support material on said vacuum imaging drum; and
    forming an intended image on said imagesetter recording film by dye removal from said imagesetter recording film.

11. The method of exposing imagesetter recording film as in claim 10, wherein said step of forming said intended image on said imagesetter recording film comprises the step of applying thermal energy by way of a printhead to said imagesetter recording film to remove dye from said imagesetter recording film.

12. An image processing apparatus for writing images to a imagesetter recording film comprising:
    a printhead having a plurality of light sources;
    a lead screw for moving said printhead;
    a vacuum imaging drum;
    support material mounted on said vacuum imaging drum;
    imagesetter recording film mounted in registration with said support material;
    a motor for rotating said vacuum imaging drum; and
    a vacuum nozzle for removing dye ablated from said imagesetter recording film.

13. The image processing apparatus according to claim 12 wherein said support material is covered by said imagesetter film.

14. The image processing apparatus according to claim 12 wherein said image processing apparatus is a laser thermal printer.

15. The image processing apparatus according to claim 12 wherein imagesetter recording film overlays said support material and said printhead writes an image to said imagesetter recording film by applying thermal energy to said imagesetter recording film to remove a dye from said imagesetter recording film, said vacuum nozzle vacuuming the dye removed from said imagesetter recording film from an area in front of the printhead.

16. The image processing apparatus according to claim 12 wherein said vacuum imaging drum has a circumferential recess having a depth substantially equal to a thickness of said support material.

17. An image processing apparatus for forming an image on a medium, said image processing apparatus comprising:
    a hollow interior vacuum imaging drum mounted for rotation about an axis and arranged to mount a support material and imagesetter recording film in superposed relationship thereon, said support material having a first length and width and said imagesetter recording film having a second length and width greater than said first length and width;

means for providing vacuum to the interior of said vacuum imaging drum, said vacuum imaging drum having a first set of support material vacuum holes and a second set of imagesetter recording film vacuum holes, said vacuum holes extend from the interior of said vacuum imaging drum to a surface of said vacuum imaging drum for applying vacuum from the interior to maintain said imagesetter recording film and said support material on said vacuum imaging drum during rotation of said vacuum imaging drum;

an axially extending flat disposed in said surface of said vacuum imaging drum arranged to accept a leading and trailing edge of said imagesetter recording film; and a circumferential recess on said surface of said vacuum imaging drum for receiving said support material;

wherein said leading and trailing edges of said imagesetter recording film overlie opposite edges of said axially extending flat without over lapping each other.

18. An image processing apparatus according to claim 13, further comprising:

a printhead which applies a thermal energy to said imagesetter recording film to remove dye from said imagesetter recording film and form an intended image thereon; and a vacuum nozzle which removes the dye removed from said imagesetter recording film from an area in front of the printhead.

* * * * *